(12) United States Patent
Azenko et al.

(10) Patent No.: US 7,315,967 B2
(45) Date of Patent: Jan. 1, 2008

(54) METHOD AND APPARATUS FOR AUTOMATIC RATE ADAPTATION IN A DOCSIS UPSTREAM

(75) Inventors: Yehuda Azenko, Cupertino, CA (US); Selim Shlomo Rakib, Cupertino, CA (US)

(73) Assignee: Terayon Communication Systems, Inc., Santa Clara, CA (US)

( * ) Notice: Subject to any disclaimer, the term of this patent is extended or adjusted under 35 U.S.C. 154(b) by 410 days.

(21) Appl. No.: 10/632,660

(22) Filed: Jul. 31, 2003

(65) Prior Publication Data

US 2005/0039103 A1   Feb. 17, 2005

(51) Int. Cl.
   G06F 11/00  (2006.01)
   G01M 19/00  (2006.01)
   G01D 3/00   (2006.01)

(52) U.S. Cl. .................. 714/704; 714/708; 714/57; 702/109

(58) Field of Classification Search .............. None
See application file for complete search history.

(56) References Cited

U.S. PATENT DOCUMENTS 5,550,837 A * 8/1996 Chang ................. 714/708
5,764,651 A * 6/1998 Bullock et al. ......... 714/708
6,765,904 B1 * 7/2004 Anandakumar et al. ... 370/389
6,859,488 B2 * 2/2005 Azenkot et al. ........ 375/147

OTHER PUBLICATIONS

"prevalent", WEBSTER's II New Riverside University Dictionary, 1984, p. 933.*

* cited by examiner

Primary Examiner—Christine T. Tu
(74) Attorney, Agent, or Firm—Thelen Reid Brown Raysman & Steiner LLP

(57) ABSTRACT

A process for automatically monitoring the packet error rate of a logical channel in a cable television DOCSIS data transmission system and automatically altering the bit rate on the channel or sending a message to a cable operator recommending a change in burst profile and bit rate. The preferred embodiment of the process comprises determining the dominant noise type and SNR of the channel and selecting a set of burst profiles best adapted for the dominant noise type and selecting an initial burst profile based upon the SNR. Then the packet error rate of the channel is monitored and compared to one or more thresholds to decide whether a change in bit rate is required to bring the packet error rate within limits. If a change is bit rate is indicated, automatically selecting a new burst profile with an appropriately changed bit rate and automatically generating and sending a UCD message defining the channel's new burst profile.

25 Claims, 13 Drawing Sheets

EXAMPLE OF BURST PROFILES OF DATA FOR DIFFERENT AWGN SNR FOR DOCSIS 1.X

| # | USE FOR IMPULSE NOISE CHANNEL YES/NO | % BIT RATE FROM MAX | NET DATA RATE @ 2.56 MSPS | MODULATION | RS | | |
|---|---|---|---|---|---|---|---|
| 1 | y | 22% | 2.3 Mbps | QPSK | k=16, t=10 | | |
| 2 | y | 29% | 3.0 Mbps | QPSK | k=28, t=10 | | |
|   |   |   | ~~3.8 Mbps~~ | ~~QPSK~~ | ~~k=58, t=10~~ | | |
| 3 | y | 39% | 4.0 Mbps | QPSK | k=78, t=10 | | |
| 4 | n | 46% | 4.7 Mbps | QPSK | k=235, t=10 | | |
| 5 | y | 50% | 5.1 Mbps | 16-QAM | k=20, t=10 | | |
|   |   |   | ~~6.0 Mbps~~ | ~~16-QAM~~ | ~~k=28, t=10~~ | | |
| 6 | y | 62% | 6.4 Mbps | 16-QAM | k=39, t=10 | | |
|   |   |   | ~~7.5 Mbps~~ | ~~16-QAM~~ | ~~k=55, t=10~~ | | |
| 7 | y | 79% | 8.1 Mbps | 16-QAM | k=78, t=10 | | |
| 8 | y | 92% | 9.4 Mbps | 16-QAM | k=235, t=10 | | |
| 9 | n | 100% | 10.24 Mbps | 16-QAM | k=16, t=0 | | |

FIG. 7

METHOD AND APPARATUS FOR AUTOMATIC RATE ADAPTATION IN A DOCSIS UPSTREAM

BACKGROUND OF THE INVENTION

DOCSIS upstream channels have programmable parameters that allow the throughput on the channel to be raised and lowered, as needed by cable system operators. These parameters are controlled for the cable modem (hereafter CM) by the cable modem termination system (hereafter CMTS). These parameters include among other things: symbol rate, modulation, error correction redundancy, whether interleaving is on or off and various parameters of the interleaving, whether Trellis encoding is on or off, whether spectrum spreading is on or off, and other things specified in the DOCSIS specifications 1.0, 1.1 and 2.0. The main parameters that are programmable and which affect the throughput are the modulation and the error correction redundancy. The upstream is a noisy environment, so forward error correction and coding gains from spread spectrum transmission is useful to combat noise while providing good upstream throughput. Lower data rates are more immune to noise and other interference, whereas higher data rates are more suitable for relatively quiet channels.

The noise level in the upstream channel tends to vary during the day. Cable system operators control the CMTS to send upstream channel descriptor messages to the cable modems (CMs) to control parameters of the upstream. This is done so that the CMTS will have 10-15 dB of noise margin to receive upstream bursts even in worst case noise situations. Generally, when noise conditions worsen, the throughput of the upstreams is reduced to provide better margin for the CMTS upstream receiver so that it can successfully receive the data.

The problem is that this scenario requires the cable system operator to constantly monitor noise conditions on the upstream channels and readjust the upstream channel parameters to alter the throughput to match the noise conditions. The alternative to constant monitoring for the cable operator is to set the parameters of the upstream channels at a throughput which is low enough to provide the desired noise margin or packet loss rate in the worst case noise conditions. When the noise level is not worst case, the throughput is set lower than it need be. This is an undesirable situation.

Therefore, it would be desirable to have a system which automatically monitors the noise level as determined by some parameter such as the packet loss rate, and automatically adjusts the throughput to lower the packet loss rate to some acceptable level. This would avoid the need for cable operators to constantly monitor noise level or packet loss rate and would maximize throughput for conditions at all times since the throughput of upstream channels would be raised automatically during low noise conditions.

SUMMARY OF THE INVENTION

There is disclosed herein a system to adjust the bit rate to the channel noise conditions automatically, or manually in some embodiments, to reduce the need for the cable system operator to monitor noise conditions on the line. The system measures the channel condition by monitoring any one or more of the following characteristics of the channel:
1) the packet loss rate;
2) the channel signal-to-noise ratio
3) the bit error rate
4) the byte error rate
5) channel impulse noise rate for dominant impulse noise channels.

The packet loss rate is the preferred measure of channel noise conditions for purposes of automatic or manual rate adaptation.

There are two modes of operation for rate adaptation by the system disclosed herein: manual and automatic. In the manual mode, the operator monitors one or more of the above channel characteristics, and makes any adjustments using preprogrammed burst profiles for the upstream. In other words, when the channel gets noise, the operator forces the CMTS to give upstream bandwidth grants on channels who burst profiles have been set for a lower throughput through the use of downstream messages broadcast to all cable modems called Upstream Channel Descriptors or UCD messages. Each UCD message describes one upstream channel and sets the programmable parameters thereof. Any cable modem (CM) which receives an upstream bandwidth grant for a particular upstream channel, must transmit at the designated time in the grant using the parameters for the upstream channel defined in the pertinent UCD message.

In automatic mode, the preprogrammed burst profiles are selected according to the line noise status and the type of interference or noise present. There are two different sets of preprogrammed burst profiles depending on the channel interference type. Channel types generally fall into two interference categories: Additive White Gaussian Noise (AWGN) channel, and Impulse Noise channel. The two sets of preprogrammed burst profiles are arranged in each group according to the bit rate and are arranged from the lowest bit rate to the maximum possible bit rate.

BRIEF DESCRIPTION OF THE DRAWINGS

FIG. 7 is a table of typical burst profile parameters for different SNR values on a DOCSIS 1.x AWGN channel.

DETAILED DESCRIPTION OF THE PREFERRED AND ALTERNATIVE EMBODIMENTS

Automatic Rate Adaptation: The channel packet loss rate is, in the preferred embodiment, measured for each logical channel separately. A logical channel is a channel upon which data is sent using one set of transmission characteristics, but a single physical channel, i.e., radio frequency carrier signal, may have more than one logical channel or be just a single logical channel. For example, in mixed mode DOCSIS systems, a single physical channel may be divided up into different time slices, each of which has data transmitted therein using a single set of transmission characteristics and each of which is a separate logical channel. For example, a mixed mode physical channel might have one time slice dedicated to transmission of Advanced Time Divison Multiple Access (ATDMA) transmissions at a first symbol rate and a second time slice dedicated to transmission of digital data using Synchronous Code Division Multiple Access (SCDMA). Each of these time slices is a separate logical channel. Likewise, one time slice may be SCDMA at a first symbol rate and another time slice may be SCDMA at a second symbol rate. Each would be a separate logical channel.

Packet loss rate is a measurement calculated or determined in the upstream receiver of DOCSIS cable modem termination systems (CMTS). CMTS upstream receivers are responsible for making various measurements on the upstream logical channels they receive. Bit error rate, byte error rate, packet loss rate and channel SNR are measurements many CMTS upstream receivers make. Some CMTS receivers that have impulse noise detection circuitry also measure impulse noise rate on a per channel basis for channels that are of the dominant impulse noise type. These measurements are available to the automatic/manual rate adaptation process for purposes of deciding whether to alter the upstream burst profile in each particular logical channel.

Hysteresis is used to alter the throughput to avoid excessive changing of burst profiles. If the packet loss rate falls below a first threshold, the data rate is increased. If the packet loss rate rises above a second threshold which is different than the first threshold, then the data rate is decreased. The thresholds should be sufficiently separated to prevent excessive switching of data rates. Each logical channel has its own pair of thresholds in the preferred embodiment to take into account the characteristics of that channel.

Figure 1:
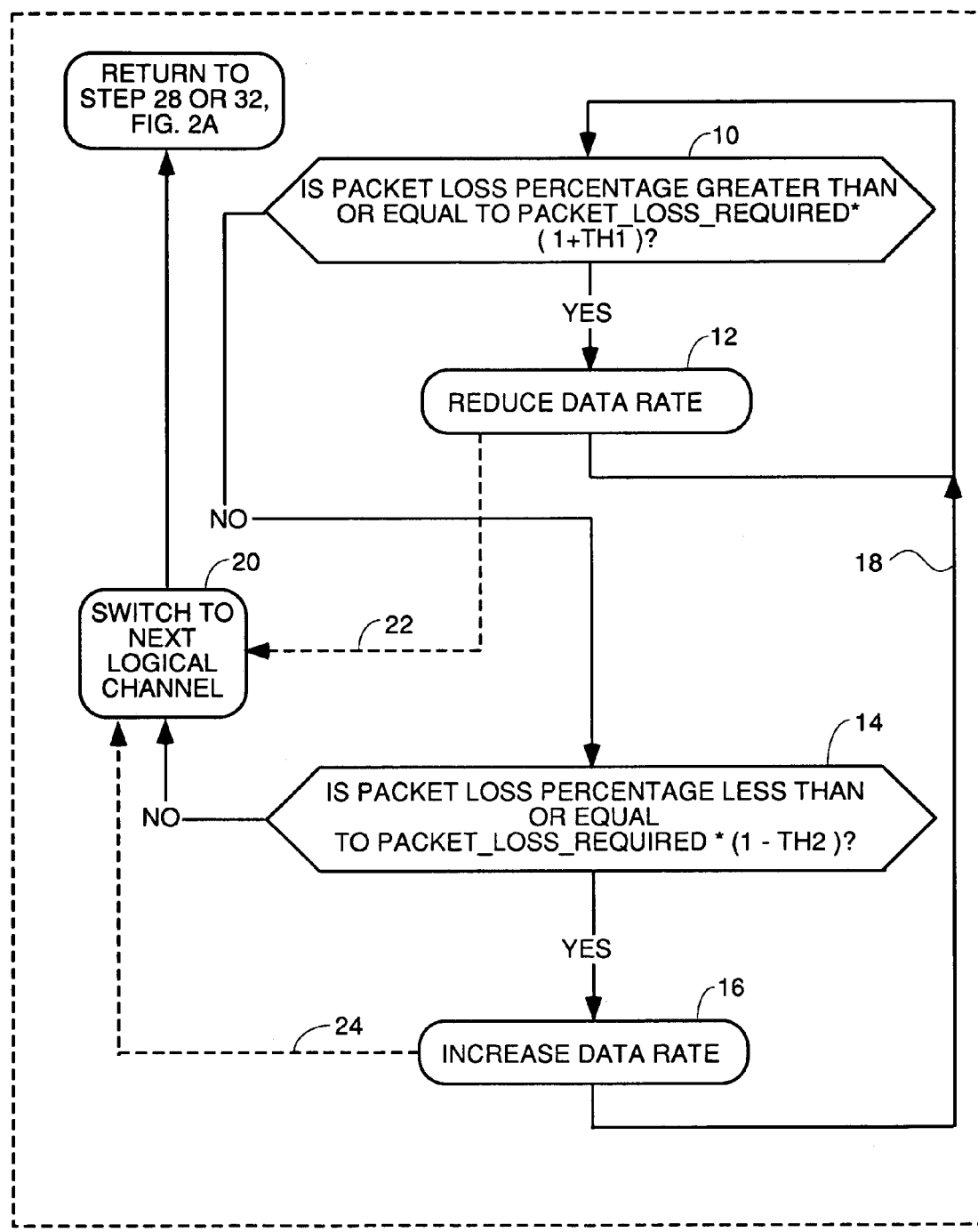
FIG. 1 is a flow diagram of the preferred embodiment for a process for deciding whether a data rate change is required using two different thresholds so that hysteresis prevents excessive data rate changes.

FIG. 1 is a flowchart illustrating the algorithm of the preferred embodiment to use hysteresis to moderate the alteration of burst profiles and data rate to situations where noise levels have changed significantly from the noise level which caused the last change in data rate. The process of FIG. 1 is repeated for each upstream logical channel when the operator has automatic rate adaptation capability turned on. In the preferred embodiment, the automatic rate adaptation is always turned on. In alternative embodiments, the operator can turn off automatic rate adaptation, and, if the operator does turn off automatic rate adaptation, no automatic rate adaptation or messages indicating that a rate adaptation should be made manually by the operator will be generated. If the operator does have automatic rate adaptation turned on, then the processes described herein to calculate a figure of channel merit for each logical channel and compare the figure of merit to one or more thresholds will be carried out for each logical channel, or at least the ones for which automatic rate adaptation is turned on.

Test 10 represents the process of retrieving the packet loss percentage figure from whatever process in the CMTS that calculates this value for the upstream channel being processed (or calculating this value in embodiments where the CMTS does not make this calculation). The process of test 10 then compares the packet loss percentage to a value calculated from a threshold TH1. TH1 is a programmable constant and is part of the pair of thresholds (TH1 and TH2) which define the hysteresis being used in this embodiment. The Packet_Loss_Required value is an operator programmable value in the preferred embodiment. Packet_Loss_Required is a value which defines an acceptable packet loss percentage, and is typically set at 0.5%. Test 10 determines if the packet loss percentage is greater than or equal to the value Packet_Loss_Required times (1+TH1). If it is, then noise conditions on the upstream channel being considered have exceeded the requirement to lower the data rate. Processing then proceeds to step 12 where the data rate is lowered either automatically or manually such as by step 10 providing a notification to the operator that a downward data rate adjustment needs to be made. If the data rate is to be altered automatically, step 12 sends a message to the process in the CMTS that composes downstream UCD messages telling it to lower the data rate on a specific upstream. More details on that process will be given below. After reducing the data rate in step 12, processing vectors back by path 18 to test 10 to start the monitoring process for this logical channel again. This is done because the fact that a change just occurred indicates that noise conditions on this logical channel are worth monitoring for a little while. In this preferred embodiment, monitoring of the logical channel will stop when tests 10 and 14 collectively determine that the packet loss percentage is not greater than or equal to the upper hysteresis threshold and not less than or equal to the lower hysteresis threshold and vector processing to step 20. Step 20 represents the process of switching to the next logical channel and starting the monitoring process over by vectoring processing to the beginning of the process (and changing the TH1 and TH2 values if they are different for the new logical channel). In some embodiments, processing is vectored to step 28 in FIG. 2A from step 20 to determine if automatic rate adaptation is turned on for the newly selected logical channel before repeating the processing of steps 32 and following. In other embodiments, processing is vectored to step 32 in FIG. 2A to repeat the processing of step 32 and following since, in this embodiment, automatic rate adaptation will be turned on for all logical channels.

If test 10 concludes that the packet loss percentage is not greater than Packet_Loss_Required times (1+TH1), processing vectors to test 14. Test 14 evaluates the packet loss percentage to determine if it is less than or equal to Packet_Loss_Required times (1−TH2). TH2 is the other of the two hysteresis thresholds. It should be set far enough from TH1 to prevent excessive switching of data rates. What is excessive switching of data rates is something which is up to the cable operator to decide.

If test 14 concludes that the packet loss percentage has fallen far enough, it vectors processing to step 16 where the data rate is increased. This can be done manually by notifying the cable operator, or automatically by sending a message to the process in the CMTS that composes UCD messages informing it that a higher data rate can be sent on this particular logical channel. After increasing the data rate in step 16, processing vectors back to test 10 via path 18 to start the monitoring process for this logical channel again.

If test 14 determines that the packet loss percentage has not decreased to less than or equal to the lower hysteresis threshold, processing vectors to step 20 where the next logical channel is picked, and processing is vectored back to step 10 to start the monitoring process for the next channel.

The packet loss percentage calculation is based on the Header Check Sum (HCS) field and the CRC of each received packet. The HCS field is a 16-bit CRC field that ensures the integrity of the Media Access Control (MAC) header of the packet, even in a collision environment. The HCS field coverage includes the entire MAC header, starting with the FC field and including any EHDR field that may be present. The HCS field is calculated using the CRC-CCITT polynomial ($x^{16}+x^{12}+x^5+1$) as defined in the ITU-T X.25 specification/standard. The CRC field is a 32-bit CRC field which ensures the integrity of the packet data unit (PDU) which contains the payload data of the packet (as defined in the Ethernet/ISO 8802-3 standard). If either the HCS or CRC field processing points to an error, the packet is considered to be an error packet and is counted toward the numerator of the packet loss percentage calculation, the denominator being the total number of packets received over a unit of time (typically 1000 packets but other numbers will work). The packet loss percentage calculation should be calculated over a sufficiently large number of packets to prevent excessive changing of the data rate. In other words, it is undesirable to use a small number of packets for the denominator of the packet loss percentage calculation, because this tends to lead to a change in data rate when channel noise conditions change over only a short time. After a switch in data rate by switching to a new burst profile, the flawed packet counter used to calculate the packet loss percentage is reset in the preferred embodiment and restarts the count.

This packet loss percentage calculation can be performed by the CMTS receiver forward error correction circuitry, or the MAC process or the process of the invention which makes the decision regarding adaptation of the data rate based upon noise conditions.

The packet loss percentage calculation is based only upon packets transmitted during non contention grants. In DOCSIS, ranging bursts are packets transmitted during contention grants as are certain other types of packets such as requests for bandwidth. These types of packets are not counted toward the packet loss percentage since there is a significant possibility of errors created by collisions.

Figure 2A:
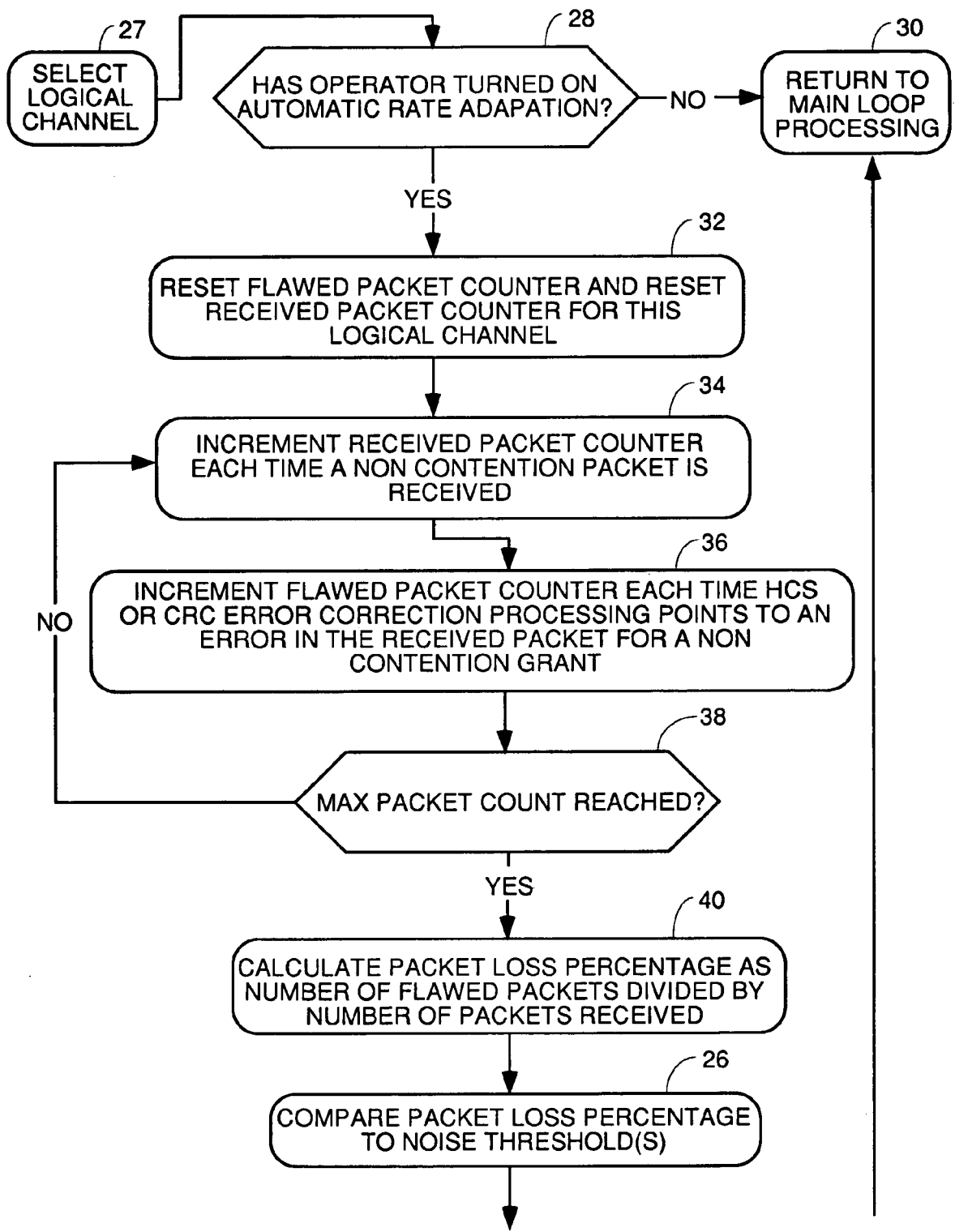
FIG. 2, comprised of FIGS. 2A and 2B, is a flow diagram for a preferred embodiment of processing in the CMTS for calculation of the packet loss percentage for each logical channel and making the determination regarding changing the data rate and changing the data rate or sending an alert to the operator to manually change the data rate.

In an alternative embodiment represented by dashed lines 22 and 24, processing is vectored to step 20 after completion of either step 12 or step 16 to pick another logical channel and then return to step 28 or setp 32 in FIG. 2A to being the process again for another logical channel. This alternative embodiment does not monitor the current logical channel being processed any further after making a change in the data rate, although all logical channels are periodically checked with one of the processes described herein to determine if a change in data rate is indicated.

Referring to FIG. 2, there is shown a flow diagram for a preferred embodiment of processing in the CMTS for calculation of the packet loss percentage for each logical channel and making the determination regarding changing the data rate and changing the data rate or sending an alert to the operator to manually change the data rate. This process is carried out separately for each logical channel, so block 27 represents whatever process is used to select the particular logical channel to be used. Block 27 is usually called by a subroutine call from the main loop of the CMTS processor, but it could be called by any other mechanism. After selecting the logical channel to be processed, test 28 determines if the operator has turned on the automatic rate adaptation process for this particular logical channel. This is the preferred embodiment. In alternative embodiments, automatic rate adaptation is either turned on or off for all logical channels, and test 28 represents making this determination. Test 28 can be performed before block 27 in these alternative embodiments. In still other alternative embodiments, test 28 can be eliminated, and the automatic rate adaptation process can be on all the time for all logical channels. If the automatic rate adaptation process is not turned on, step 30 is executed to return to the calling program.

If automatic rate adaptation is turned on, step 32 is performed to reset the flawed packet counter and reset the total number of packets received counter for this particular logical channel. These counters can be implemented in either hardware or software. Next, step 34 is performed to increment the received packet counter each times a packet with a MAC header is received which is transmitted pursuant to a grant for a non contention interval. Packets transmitted for contention grant intervals like ranging packets and bandwidth request packets are not counted because they frequently suffer collisions. In the preferred embodiment, only packets that are not transmitted during contention grants are counted, so step 34 also represents the embodiments where the received packet is discarded if it is transmitted during a contention grant such as ranging. In these embodiments, the incrementation of the received packet counter and the flawed packet counter only occurs if the packet is not discarded. Step 36 is then performed to receive the packet and determine if there is an error in the packet and increment the error count. In the preferred embodiment, this processing is carried out by incrementing the flawed packet counter each time processing of the HCS or CRC field of the received packet points to an error in the packet. Step 38 is then performed to compare the count in the total number of packets received counter to see if this counter has reached the maximum packet count limit. This limit is programmable in the preferred embodiment, but may be fixed in other embodiments. Typically it is 1000 or some other fairly large number to prevent excessive switching of data rates.

Step 40 is performed when a fixed number of packets has been received and test 38 exits on the Yes path. The function of step 40 is to calculate the packet loss percentage. The calculation of step 40 takes the number of flawed packets, as determined by the flawed packet counter count, and divides this number by the total number of packets received, as determined by the count in the received packet counter.

Next, step 26 is performed to compare the packet loss percentage to the noise threshold or to two hysteresis noise thresholds if two noise thresholds are used. In the preferred embodiment, step 26 is all the processing shown in FIG. 1, and two noise thresholds are used to implement hysteresis to prevent excessive data rate switching. In alternative embodiments, only a single noise threshold is used, and the data rate is decreased when the packet loss percentage rises above it, and increased when the packet loss percentage falls below it, and step 26 was generically worded to cover all these alternative embodiments.

Test 42 represents the determination made from the comparison of step 26 as to whether the data rate needs to be changed because of the current value for the packet loss percentage. Because the flowchart of FIG. 2 also represents a single threshold embodiment, step 42 is shown separately, although, in embodiments where two thresholds and hysteresis are used, step 42 is really part of the processing of step 26, as shown in FIG. 1.

If test 42 concludes that a data rate change is needed, step 44 is performed to send a message to the appropriate process to change the data rate. Step 46 represents the process of either automatically changing the date rate or providing a visible or audible message to the cable operator to consider changing the data rate. If automatic changing of the data rate is implemented, step 46 selects a burst profile from a table of burst profiles for the next data rate up or the next data rate down, as appropriate from the comparison of the packet loss percentage to the noise threshold(s). After the new burst profile is picked, a new UCD message is prepared and transmitted to all cable modems. This UCD message broadcasts the new upstream channel descriptor parameters for the logical channel being processed and includes the new data rate descriptors such as modulation type, number of parity bits, symbol rate, etc. Processing then returns to the main loop, as symbolized by path 48 returning to step 30. If test 42 determines that no change in the data rate is needed, path 48 is taken to step 30.

If manual data rate change is to be implemented, step 46 represents the process of displaying or sounding an audible alert to the operator, or both, indicating that the operator should consider increasing the data rate or decreasing it for a particular logical channel, as appropriate.

In alternative embodiments, only a single threshold is used to make the determination. In still other alternative embodiments, other measures are used to make the determination of when to switch the data rate and either two thresholds separated by a hysteresis margin or a single threshold can be used. The measures that may be used to make the data throughput determination of what burst profile to assign to an upstream channel are:
1) packet loss rate,
2) bit error rate,
3) byte error rate,
4) channel SNR for AWGN channels, ingress noise and other interference type channels,
5) channel impulse noise rate for channels dominated primarily by impulse noise.

Channel Signal-To-Noise Ratio

The signal-to-noise ratio (SNR) of every logical channel can be measured. This measurement is done by the CMTS upstream receiver and is based on the QAM constellation error. The QAM constellation error is determined from the received constellation point versus the hard decision value of the slicer (the actual I and Q values of the ideal constellation point which was transmitted). Any variation between the hard decision value and the received constellation point is caused by noise in the channel, so the degree of variation is indicative of the SNR of the channel. The signal power used in this calculation is the nominal expected power level. In DOCSIS systems, the CMTS controls the transmission power of every cable modem (CM) in the system so that signals transmitted from that CM arrive at the CMTS at the nominal power.

The automatic rate adaptation system can use the SNR to change the logical channel throughput also in this alternative embodiment by calculating the SNR, comparing it to some figure of merit and selecting a burst profile with the appropriate throughput.

Figure 3A:
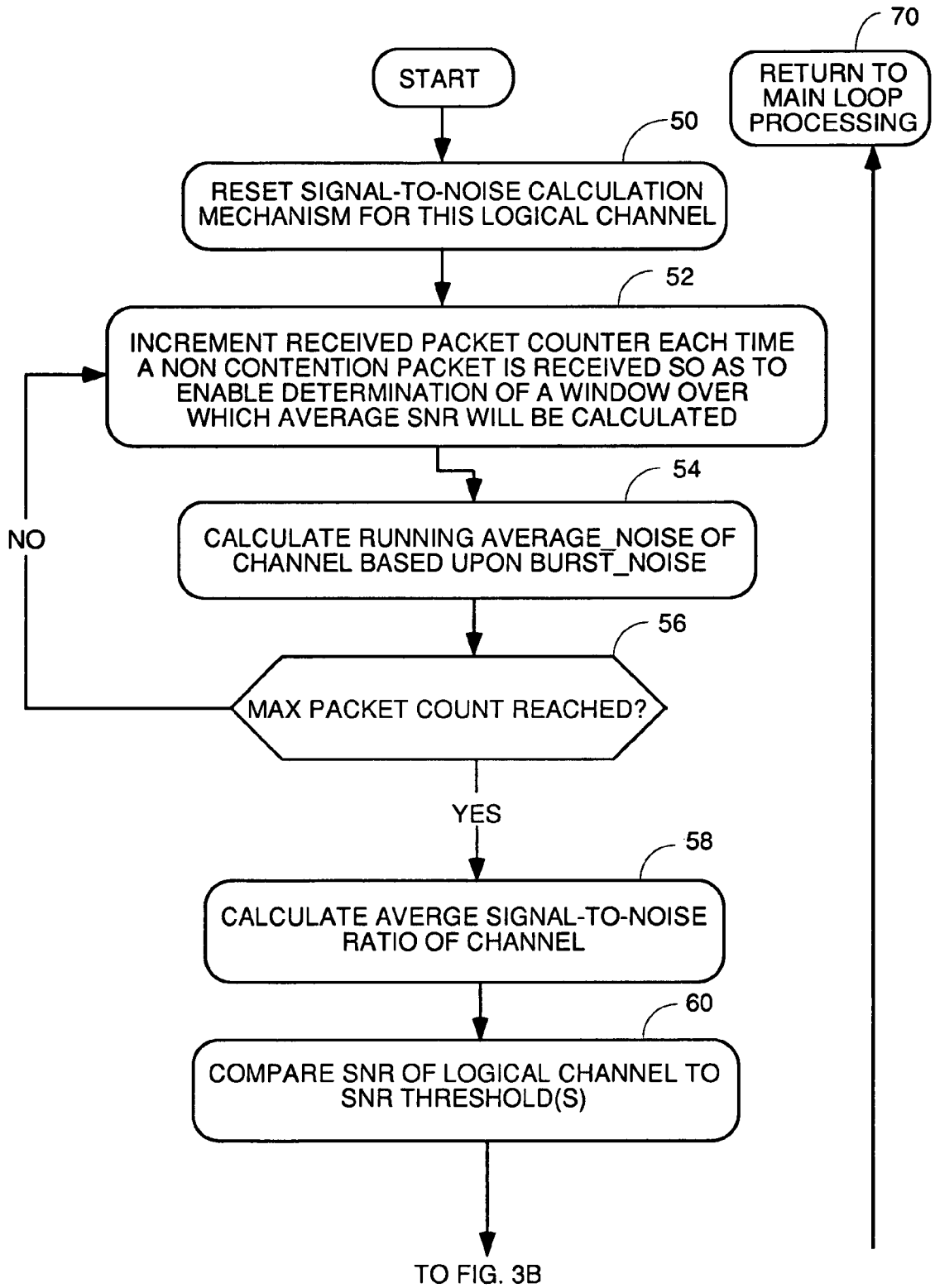
FIG. 3, comprised of FIGS. 3A and 3B, is a flowchart of the CMTS processing for automatic rate adapation using SNR.
Figure 3B:
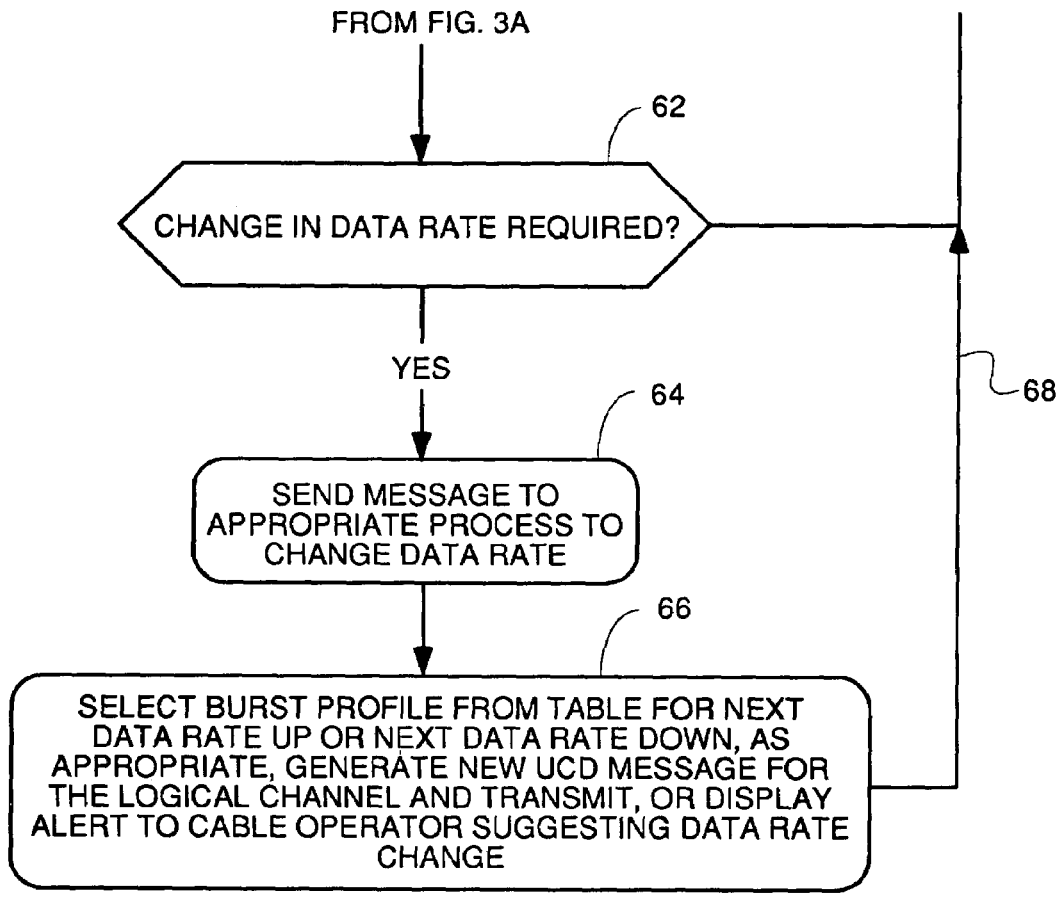

FIG. 3, comprised of FIGS. 3A and 3B, is a flowchart of the CMTS processing for automatic rate adapation using SNR. As was the case for the flowchart of step 2, steps to selected a logical channel and determine whether automatic rate adaptation is turned on for the logical channel can be added to the flowchart of FIG. 3 for some embodiments. Only the steps to process a single logical channel assuming automatic rate adaptation is turned on are shown. The total packets received counter and flawed packets counter are eliminated in this embodiment, and a mechanism to calculate an average signal-to-noise ratio over a time interval or window is substituted. Step 50 represents the process of resetting a signal-to-noise (SNR) averaging mechanism for this logical channel. Step 52 increments the received packet counter each time a non contention packet is received. In the preferred embodiment, only packets that are not transmitted during contention grants are counted, so step 52 also represents the embodiments where the received packet is discarded if it is transmitted during a contention grant such as ranging. In these embodiments, the incrementation of the received packet counter only occurs-if the packet is not discarded. Step 54 calculates the running average_noise based upon a burst_noise value output by PHY chip in the CMTS receiver. Every ranging burst has a burst_noise value output by conventional PHY chips. The PHY chip of the invention will have its circuitry modified to output an average_noise measurement for every burst or at least for every non contention burst. The average_noise measurement is based upon the average variance between the I and Q values of the received constellation points that have been noise corrupted versus the ideal I and Q values of the constellation point that would have been received in a perfect channel where noise corruption did not occur (the original constellation point transmitted). The noise power in a noise corrupted constellation point is proportional to the square of the distance between the I value received and the ideal I value averaged with the square of the distance between the Q value received and the ideal Q value. The average_noise measurement is output on a per burst basis. The running Average noise would be the running sum of average_noise values divided by the total number of average_noise values taken into account in the calculation (the total number of average-noise measurments added together by the end of the window interval). In alternative embodiments, the average_noise value is an analog signal which is passed through a low pass filter to get the average value. The level at the output of the low pass filter at the time the averaging interval ends is the average_noise for that interval.

Step 56 determines if the max received packet count has been reached signifying the end of the interval over which average SNR is to be calculated. If not, processing returns to step 52 to continue to receive packets. If the max packet count has been reached, step 58 calculates the average SNR of the logical channel over the interval defined by the maximum packet count using the average variances of the received constellation points from the hard decision thresholds that define the actual I and Q values of the transmitted constellation point. The average SNR will be the nominal signal power divided by the square of the average_noise over the interval.

Step 60 compares the average SNR of the logical channel to one or more constants calculated from a programmable SNR_REQUIRED value selected for the burst profile in use for the logical channel as modified by an SNR threshold. In the preferred embodiment, an SNR threshold TH1 is subtracted from the value SNR_REQUIRED and a SNR threshold TH2 ia added to the SNR_REQUIRED value. Although hysteresis and two SNR thresolds are the preferred embodiment, in alternative embodiments, only a single threshold is used. Step 60 comprises the following algorithm in the preferred embodiment:

(1) IF average SNR<average SNR_REQUIRED*(1−TH1), Then Reduce The Data Rate Throughput, Preferably According To A Preprogrammed Burst Profile Table By Picking The Next Date Rate Down;

(2) IF average SNR>average SNR_REQUIRED*(1+TH2), Then Increase The Date Rate, Preferably According To Preprogrammed Burst Profile Table By Picking The Next Data Rate up;

(3) End.

TH1 and TH2 are threshold average SNR ratios separated by a sufficient amount to provide a hysteresis amount which is sufficient to prevent excessive data rate switching. average SNR_REQUIRED is the required amount of average SNR for acceptable transmission quality and error rate for the specific burst profile in use.

In alternative embodiments, only a single SNR threshold may be used.

Step 62 determines if there is a need to change the data rate based upon the comparisons done in step 60. If not processing returns to the calling function, as represented by step 70. If so, step 64 is performed to send a message to the appropriate process to change the data rate.

Step 66 then is performed to select a new burst profile as appropriate to increase the data rate throughput. In the preferred embodiment, the data rate is increased up by one step or down by one step, as the case may be in a burst profile table. The term step is intended to mean one step in a burst profile table that lists burst profiles in ascending or descending order of data throughput rate. In the preferred embodiment, after the new data rate is automatically selected, an UCD message is prepared that defines the logical channel being processed and includes its new data throughput rate. This UCD message is broadcast to all CMs or at least to those which might be assigned to the logical channel. In manual systems, step 66 represents generating a visible or audible alarm to the operator suggesting a data rate change. As is the case for FIG. 2, step 66 represents picking a new data rate or burst profile and suggesting this data rate be adopted for a new UCD message for this logical channel.

Figure 4A:
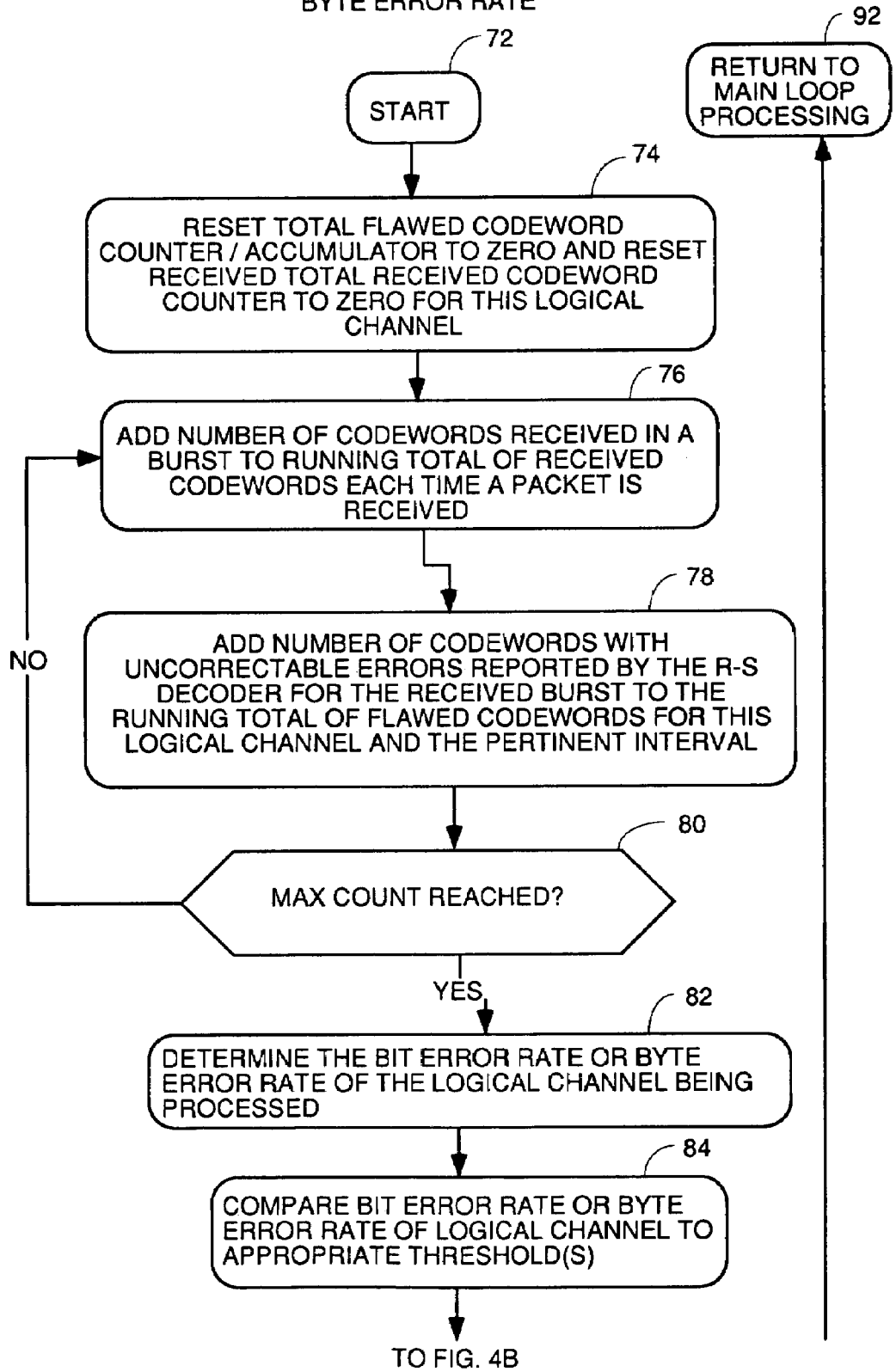
FIG. 4, comprised of FIGS. 4A and 4B, is a flowchart of the process to implement automatic rate adaptation on a logical channel using bit error rate or byte error rate as an indicator.
Figure 4B:
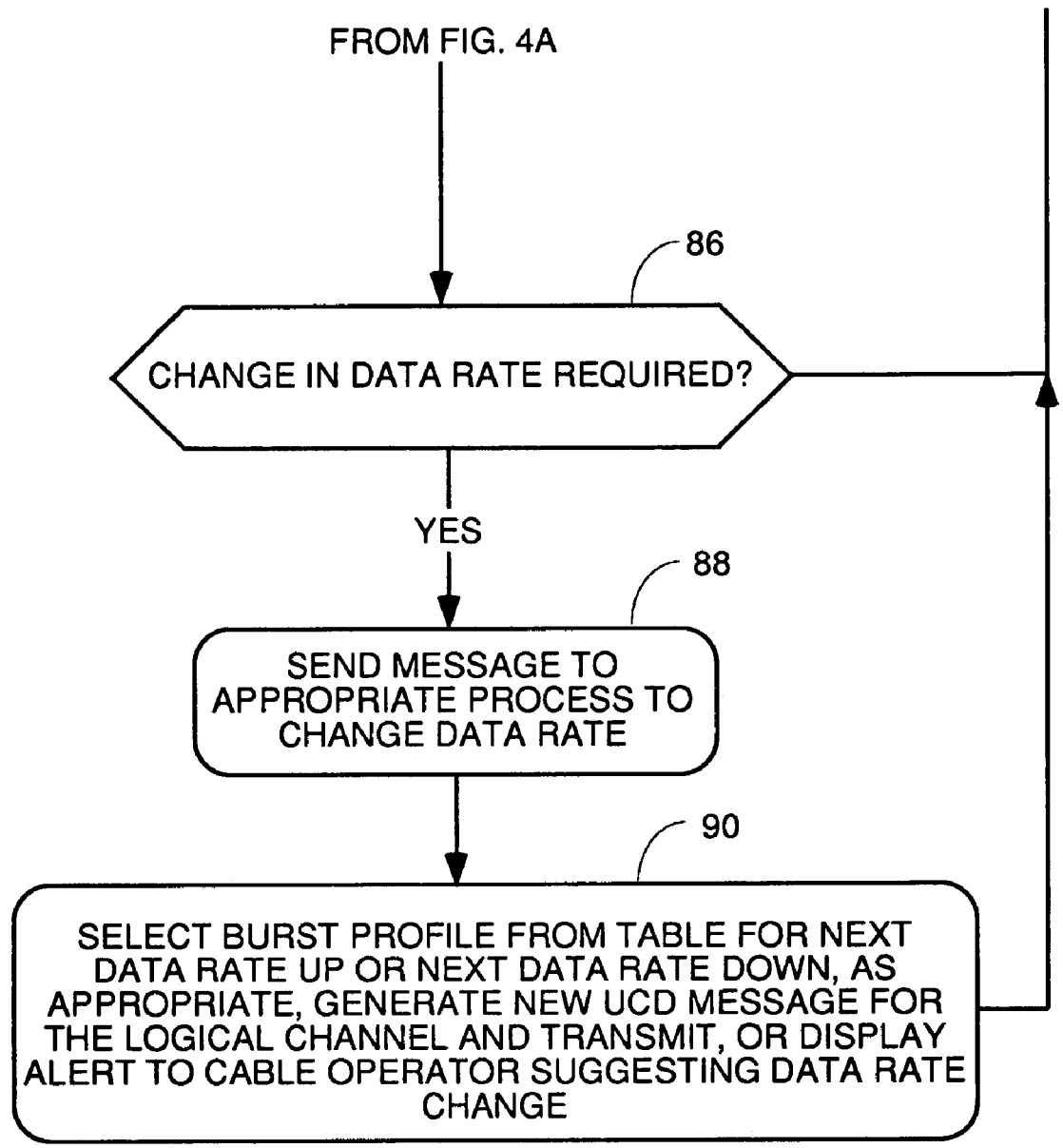

Referring to FIG. 4, comprised of FIGS. 4A and 4B, there is shown a flowchart of the process to implement automatic rate adaptation on a logical channel using bit error rate or byte error rate of the logical channel as an indicator. The process starts at 72 and transitions to step 74 where a total codeword counter/accumulator is reset to zero. The total codeword counter/accumulator sums the total number of codewords received during the pertinent interval. Step 74 also resets a total flawed codeword counter/accumulator to zero. The total flawed codeword counter/accumulator sums the total number of codewords with uncorrectable errors during the pertinent interval. Each counter/accumulator is reset to zero for the particular logical channel being processed.

When each burst is received by the CMTS, the R-S decoder in the PHY circuitry makes three measurements for each burst which are output to the MAC process. The number of good codewords with no errors is output. The number of codewords that had errors that were corrected is output. And finally, the number of codewords with uncorrectable errors is also output. Each codeword has a plurality of bytes which depends upon the codeword size.

Step 76 represents the process of receiving a packet and adding the total number of codewords received to the running total of codewords received for this logical channel for the interval being processed. This can be done in an accumulator in hardware or by a software process to keep the running total. This is done only if the packet is not transmitted in response to a contention grant. Any packets received which were transmitted in response to a contention grant are discarded are discarded in the preferred embodiment, and only packets with specific interval usage codes (IUCs) are counted. In the preferred embodiment, only packets with the IUCs of a long data packet are counted, but in alternative embodiments, the total number of codewords received in both long and short data packets is counted. The running total of codewords received for this logical channel at the end of the interval is the quantity n-total in equation (1) below.

Step 78 represents the process of adding the number of codewords reported to have uncorrected errors to the running total of codewords with uncorrectable errors for this logical channel for the interval being processed. This quantity is the variable n_error in equation (1) below. The reference to a specific IUC in the definition of n_error below is a reference to the fact that in the preferred embodiment, only the number of uncorrectable codewords in a burst having the IUC of a long data packet are counted. In other embodiments, other non contention IUCs can be included.

Step 80 represents the process of determining if the desired interval has elapsed. This can be done by comparing the total number of packets has been received to a programmable number of maximum packets to process before making a judgment as to whether the data rate of the channel should be increased or decreased. This can also be done by counting the total number of codewords or bytes received.

In the embodiment represented by FIG. 4, the judgment as to whether to increase or decrease the data rate is based upon the bit error rate or byte error rate of the logical channel. Step 82 represents the process of calculating or obtaining the bit error rate or byte error rate of the logical channel being processed. In the preferred embodiment, the MAC process running in the CMTS determines the bit error rate or byte error rate by evaluating equation (1) below. In other embodiments, the rate adaptation process calculates the bit error rate or byte error rate itself by evaluating equation (1) below.

$$ByteErrorRate = \frac{(T+1) * \text{n\_error}}{(k+2T) * \text{n\_total}} \qquad (1)$$

where

T: the number of maximum correctable bytes in an Reed-Solomon (hereafter R-S) codeword.

T+1: when there is an uncorrectable R-S codeword, there is a high probability of having T+1 flawed bytes.

n_error: the total number of uncorrectable R-S codewords over the pertinent interval. This is counted for a specific IUC burst type over an interval determined by step 80 in the preferred embodiment. The number of uncorrectable codewords per burst are output as a measurement made by the R-S decoder in the PHY chip and is sent to the MAC process where a running sum over the pertinent interval is kept.

n_total: the total number of received R-S codewords within a certain time interval. In the preferred embodiment, on the total number of codewords for a specific IUC burst are counted, but in alternative embodiments, the total number of codewords for multiple IUC burst types of a non contention nature are counted.

k: the number of information bytes in an R-S codeword of a specific IUC; and k+2t: the R-S codeword length in bytes.

Since on average, only half of the bits are erroneous, the bit error rate BER is given by:

$$BER = \frac{0.5*(T+1)*n\_error}{(k+2T)*n\_total} \quad (2)$$

Generally, but not in all embodiments, the long data grant IUC is used the calculate the BER or the byte error rate. Step 82 represents the process of calculating the BER or byte error rate by evaluating the appropriate one of formulas (1) or (2) either in the CMTS MAC process or the automatic rate adaptation process itself.

Step 84 represents the process of comparing the bit error rate or byte error rate calculated in step 82 to one or more thresholds. Assuming a single threshold is used, if the BER or byte error rate is above the threshold, the data rate will have to be reduced. If the BER or byte error rate is below the threshold, the data rate will have to be increased.

Figure 2B:
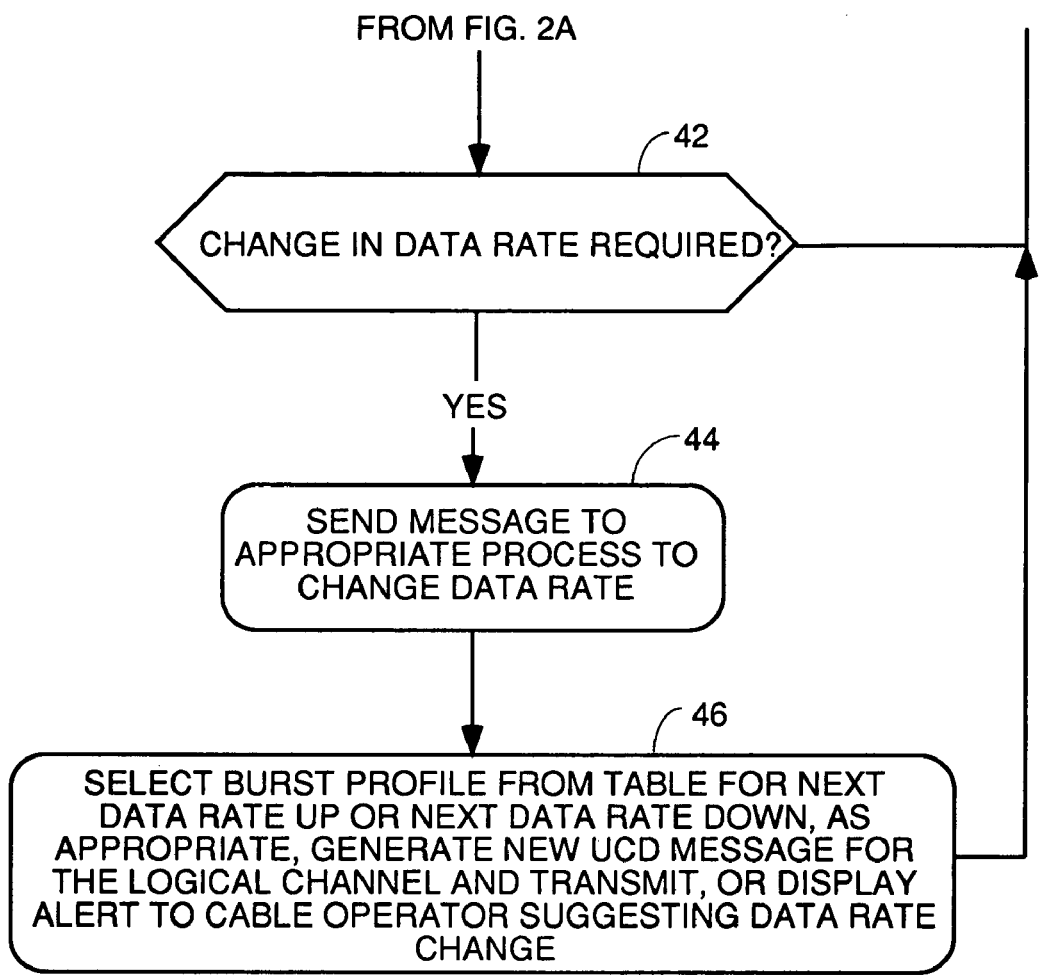

Step 86 makes the determination as to whether the data rate must be changed based upon the results of the comparison. If a conclusion is drawn that the data rate must be changed, step 88 is performed to send a message to the appropriate process to change the data rate. This step may be eliminated in some embodiments, as is true for the identical step in FIGS. 2B and 3B, and processing may proceed directly to actually changing the data rate, as symbolized by step 90. Step 90, as is the case for the identical steps in FIGS. 2B and 3B, represents any way of changing the data rate in the appropriate direction based upon the comparison to the threshold(s). In the preferred embodiment, this is done by selecting the next burst profile up or down, as appropriate, from the current burst profile in a table that lists burst profiles in ascending or descending order of data rates. Step 90 also represents the process of generating and sending a new UCD message for the logical channel being processed to set new transmission parameters for the logical channel which includes parameters to implement the new data rate. If step 86 determines that no new data rate is necessary, processing flows to step 92 to return to the main loop of processing. Typically, the main loop will select a new logical channel, and call the process again by vectoring processing to step 72.

Initial Processing to Determine Channel Type and Select Initial Burst Profile

Some channels have a large amount of impulse noise. Other channels are primarily average white gaussian noise (AWGN). The burst profile that should be selected for each different type of channel differs based upon whether the channel is AWGN or has more impulse noise. The optimum burst profile for an AWGN channel is not suitable for an impulse noise channel because reducing the modulation level to improve the BER for AWGN might do the opposite for an impulse noise channel when the R-S code is weaker. Therefore, in the preferred embodiment, two sets of burst profiles are used, each set optimized for a different type of noise on the channel. One set is optimized for AWGN channels, and the other is optimized for impulse noise channels. Each set is included in a table and sorted by ascending order of bit rate in steps. The burst parameters of modulation type, Error Correction Code parameters (k, T for R-S error correction codes, and Trellis coding enabled or disabled for Trellis Code Modulated (TCM) bursts, as well as the preamble length and the number of active codes for Synchronous Code Division Modulated bursts define the bit rate of a burst profile.

For channels with a large amount of impulse noise, the R-S code rate should be kept low. The symbol rate and carrier frequency burst parameters may also be adjusted in impulse noise channels to improve the performance in the following cases:

1) impulse noise present and a low SNR (in such a case, a lower symbol rate is more robust in the presence of impulse noise interference and AWGN);

2) narrow band interference or ingress noise (in such a case, a change in the symbol rate or the carrier frequency can shift the spectrum sufficiently out of the interference to improve the performance).

The burst profiles are selected automatically in some embodiments, and manually in others, but in each case, the burst profile should be selected according to the type of channel noise which is prevalent. The generic process to do this is described next.

Figure 5:
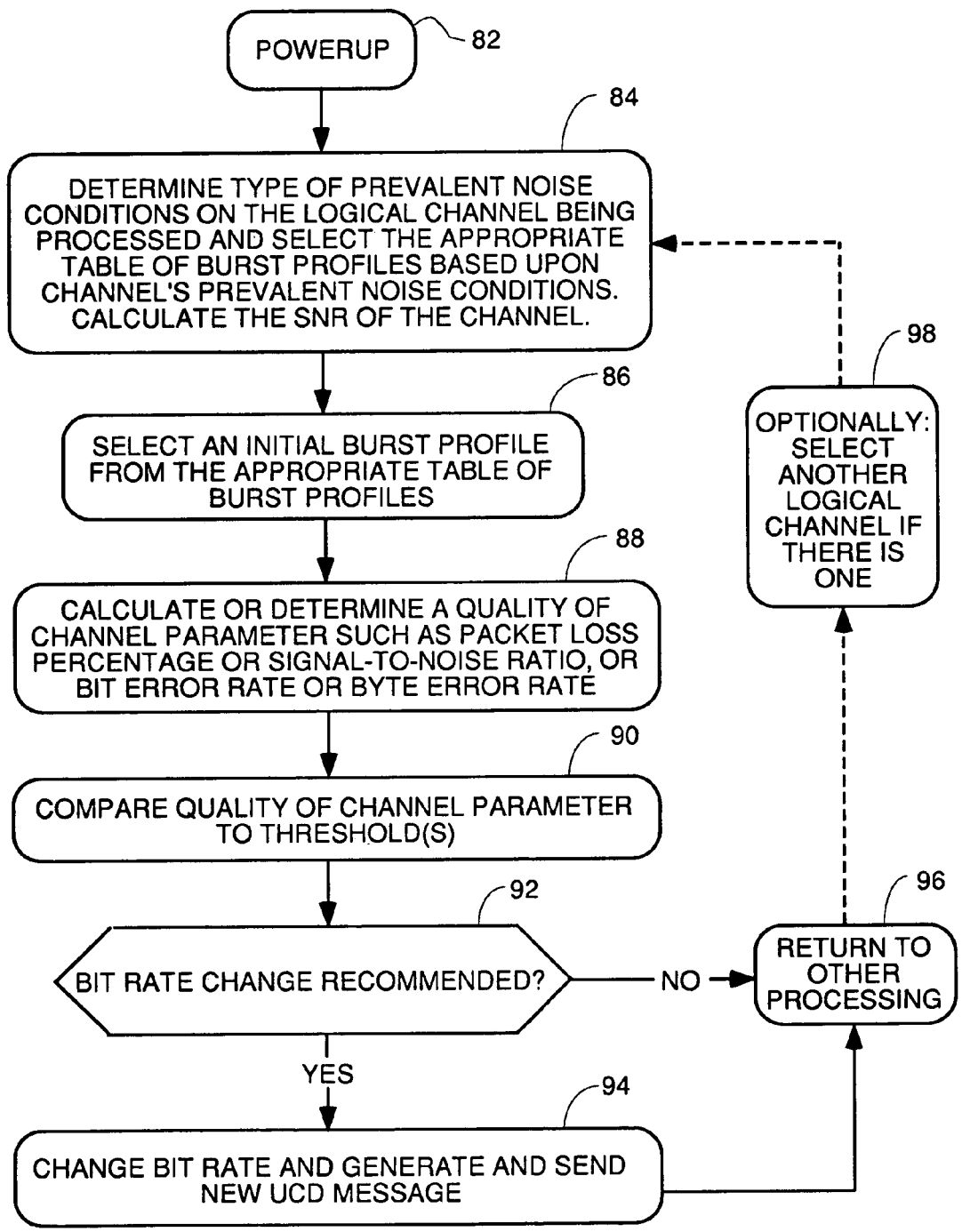
FIG. 5 represents a flowchart for a generic process to determine the channel type, monitor noise conditions and automatically change the bit rate.

FIG. 5 represents a flowchart for a generic process to determine the channel type, monitor noise conditions and automatically change the bit rate. In automatic mode, the process of burst profile selection starts first with a determination of whether the channel is AWGN or impulse noise, as symbolized by step 84. This is one of the first things that happens in the CMTS boot process after powerup step 82. A channel may be characterized as AWGN or impulse noise by any process that works. The channel SNR and the impulse noise length and rate are good tools to estimate the line noise conditions. The channel SNR can be estimated by measuring the received input signal power during upstream minislots that not have been awarded to any cable modem (meaning no CM is transmitting during those minislots). The SNR can then be calculated by dividing the nominal power the CMTS commands CMs to use when transmitting by the measured noise power represented by the input power received when no CM was transmitting.

The existence of impulse noise on the channel can be determined in step 82 by monitoring the erasure output signals from the impulse noise detector. In the CMTS, an impulse noise detector circuit detects the presence of impulse noise and outputs erasure indications for samples of input signals from a logical channel that may be affected by impulse noise. The erasure percentage can be used to determine whether a channel is characterized by impulse noise. The impulse noise detector in the CMTS receiver outputs an erasure signal which is kept active for the duration of the detected impulse noise. Impulse noise can be detected in accordance with the teachings of U.S. patent application Ser. No. 10/255,286, filed Sep. 25, 2002 which is hereby incorporated by reference. If the number of erasures in a window of time is smaller than a predetermined threshold, the channel is determined to be an AWGN channel.

The impulse noise detector in the CMTS has three counters called "TDMA_erasure_count", "SCDMA_erasure_count" and "sub_symbol_count". All three counters are 32 bits in width. The "TDMA_erasure_count" counter counts the number of erasure samples in the TDMA channel over a specific interval, which means the number of samples that have an erasure bit set. The "SCDMA_erasure_count" counter counts the number of erasure samples in the SCDMA channel over a specific interval. The "sub_symbol_count" counter counts the number of sub_symbols over the same specific interval. The erasure percentage for TDMA and SCDMA logical channels is defined by the following equations.

$$TDMA\_erasure\_percentage = \frac{TDMA\_erasure\_count}{sub\_symbol\_count} * 100 \quad (3)$$

$$SCDMA\_erasure\_percentage = \frac{SCDMA\_erasure\_count}{sub\_symbol\_count} * 100 \quad (4)$$

In the preferred embodiment, the determination as to whether a logical channel is dominated by impulse noise is determined by the following monitoring algorithm to switch over to a characterization of a channel as an impulse noise dominated channel if the logical channel is currently deemed an AWGN channel:

if
        TDMA_erasure_percentage>TDMA_erasure_percentage_
        required*(1+TT1) then TDMA channel
        type=Impulse Noise End TT1 is a threshold used to establish the upper limit of TDMA_erasure_percentage which is tolerated before a logical channel is declared to be an impulse noise dominated channel.

In the preferred embodiment, the determination as to whether a logical channel is dominated by AWGN is determined by the following monitoring algorithm to switch over to a characterization of a channel as an AWGN dominated channel if the logical channel is currently deemed an impulse noise channel:

if
        TDMA_erasure_percentage<TDMA_erasure_percentage_
        required*(1−TT2) then TDMA channel
        type=AWGN End TT2 is a threshold used to establish the lower limit of TDMA_erasure_percentage which is tolerated before a logical channel is declared to be an AWGN dominated channel. TT1 and TT2 are separated by enough distance to provide a hysteresis effect to prevent excessive switching between channel characterization. Default values for TT1 and TT2 are TT1=0.3 and TT2=0.3. TDMA_erasure_percentage_required is a programmable constant in the preferred embodiment, but a fixed constant in other embodiments. A typical default value is 5.

For SCDMA channels, the determination of dominant noise type on a logical channel is determined in a similar fashion using the following monitoring equations and algorithm. If the SCDMA channel is deemed AWGN, monitoring to recharacterize the channel as impulse noise dominated is done by evaluating the expression and the following algorithm if
        SCDMA_erasure_percentage>SCDMA_erasure_percentage_
        required*(1+ST1) then SCDMA channel
        type=impulse noise End If the SCDMA channel is deemed impulse noise, monitoring to recharacterized the channe as AWGN is done by evaluating the expression and the following algorithm if
        SCDMA_erasure_percentage<SCDMA_erasure_percentage_
        required*(1−ST2) then SCDMA channel
        type=AWGN End ST1 and ST2 are constants used for hysteresis to prevent excessive switching of channel characterization. Default values are ST1=0.1 and ST2 equals 0.1, and SCDMA_erasure_percentage_required is a programmable constant in the preferred embodiment, but a fixed constant in other embodiments.

Once the dominant noise characteristic of the channel is determined, the set of burst profiles for AWGN or impulse noise channels is selected, as appropriate, as symbolized by step 84.

Next, as symbolized by step 86, an initial burst profile is selected from the set of burst profiles adapted for the particular type of logical channel noise conditions present. The burst profile can be any profile, but preferably will be the slowest bit rate in some embodiments where monitoring of noise conditions on each channel occurs frequently and periodically so that the bit rate can be raised soon. In the preferred embodiment, the initial burst profile is selected based upon the calculated SNR from step 84 with high SNRs causing a high bit rate to be selected initially and low SNRs causing a low bit rate to be selected initially.

Then, as symbolized by steps 88 and 90 and 92, noise conditions are continually monitored, and the appropriate adjustments to the burst profile are made by selecting from the appropriate set of burst profiles according to the packet loss percentage, the SNR, the BER or the byte error rate. The processes to calculate packet loss percentage, SNR, BER or byte error rate and compare the calculated result to thresholds for making a decision regarding changing the bit rate have been previously described. Any one of these processes can be used for step 88 to calculate the quality of channel parameter indicative of current noise conditions. Step 90 represents the process of comparing the quality of channel parameter so calculated to one or more thresholds, and step 92 represents the process of evaluating the comparison results and drawing a conclusion regarding whether a change in bit rate is recommended.

If the packet loss percentage, BER or byte error rate is too high, or the SNR is too low, the next burst profile down in the table of burst profiles selected in step 84 is selected, as symbolized by step 94. In other words, the next burst profile down with a lower bit rate will be selected by step 94 if noise conditions have increased. If the packet loss percentage, BER or byte error rate is lower than the pertinent threshold, or the SNR is higher than the threshold, the next burst profile up in the selected table with a higher bit rate is selected in step 94 to take advantage of improved noise conditions. Step 94 also automatically generates and sends a UCD message so that all CMs using the logical channel for which the bit rate was just changed will start using the new burst profile.

After step 94, step 96 returns processing to whatever other processing in the boot process is required. If step 92 concludes no change in bit rate is needed, step 96 is performed also. In some embodiments where multiple upstream logical channels are in use, step 98 is optionally performed after or before step 96 to select a new logical channel and repeat the process for this new logical channel.

Figure 6:
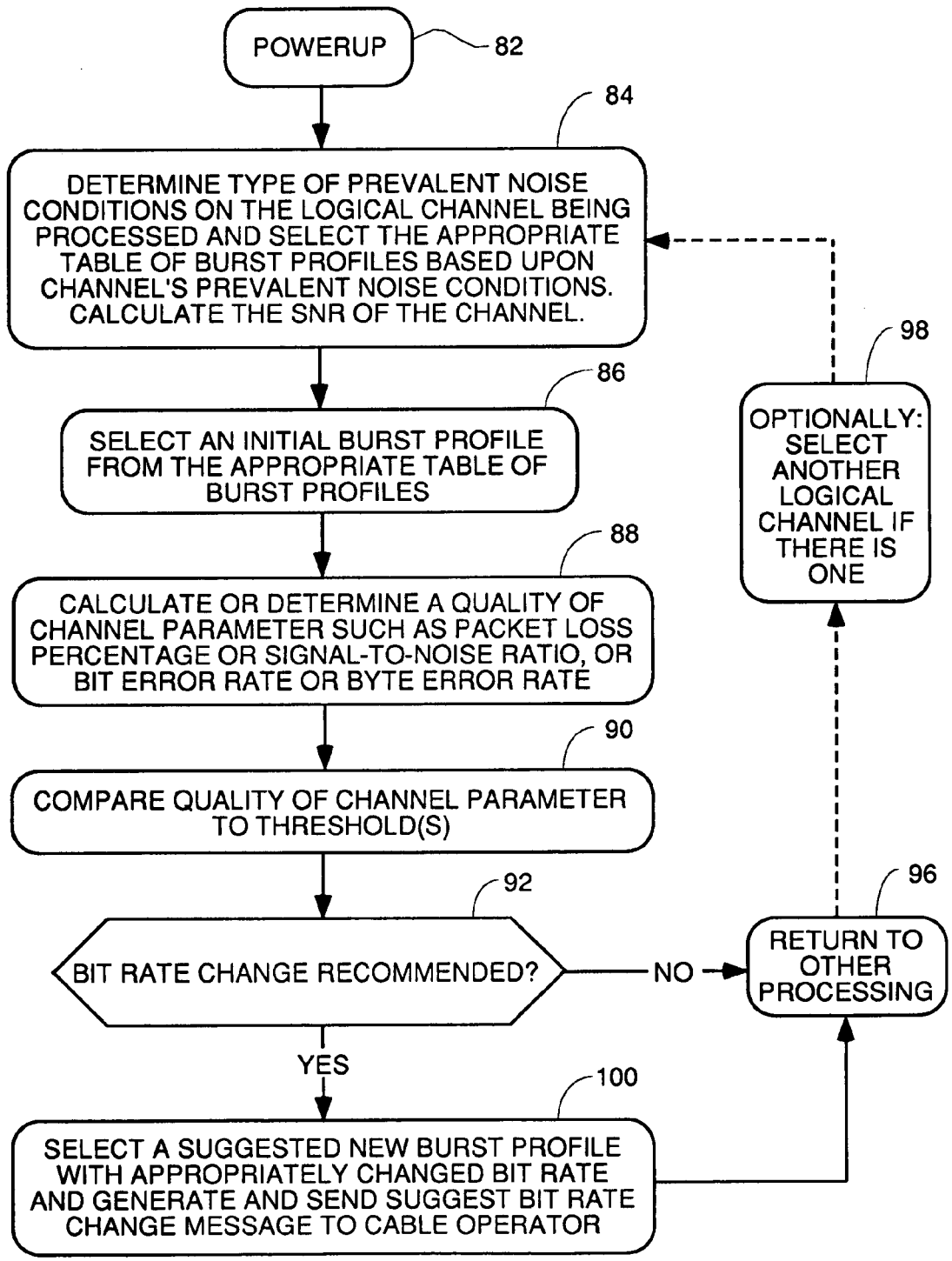
FIG. 6 is a flow diagram for a process like that shown in FIG. 5 but for manual changes in bit rate.

FIG. 6 is a flow diagram for a process like that shown in FIG. 5 but for manual changes in bit rate. The process of FIG. 6 automatically determines the dominant noise type on the channel and picks the appropriate set of burst profiles for the dominant noise type, and automatically monitors noise conditions, and when a data rate change is indicated, generates a message indicating to an operator that a data rate change is advisable. The difference between the process of FIG. 5 and FIG. 6 is embodied in step 100 where instead of automatically picking a new burst profile and generating a UCD message, a message is generated to the cable operator suggesting a bit rate change.

The optimal burst profiles for impulse noise channels generally require shorter R-S codewords. The optimal burst profiles for impulse noise channels have the following characteristics:
(1) R-S information symbol k is small and is adjusted according to the number of erasures in an RS codeword.
(2) The R-S interleaver depth, used only for advanced TDMA logical channels in DOCSIS 2.0 compatible systems, is large (according to the impulse noise duration), and the RS interleaver length is k+2t. In dynamic mode, the R-S interleaver size Br has to be set accordingly.
(3) The number of spreading intervals per SCDMA frame in DOCSIS 2.0 compatible systems is large.

FIG. 7 is a table of typical burst profile parameters for different SNR values on a DOCSIS 1.x AWGN channel.

Figure 8:
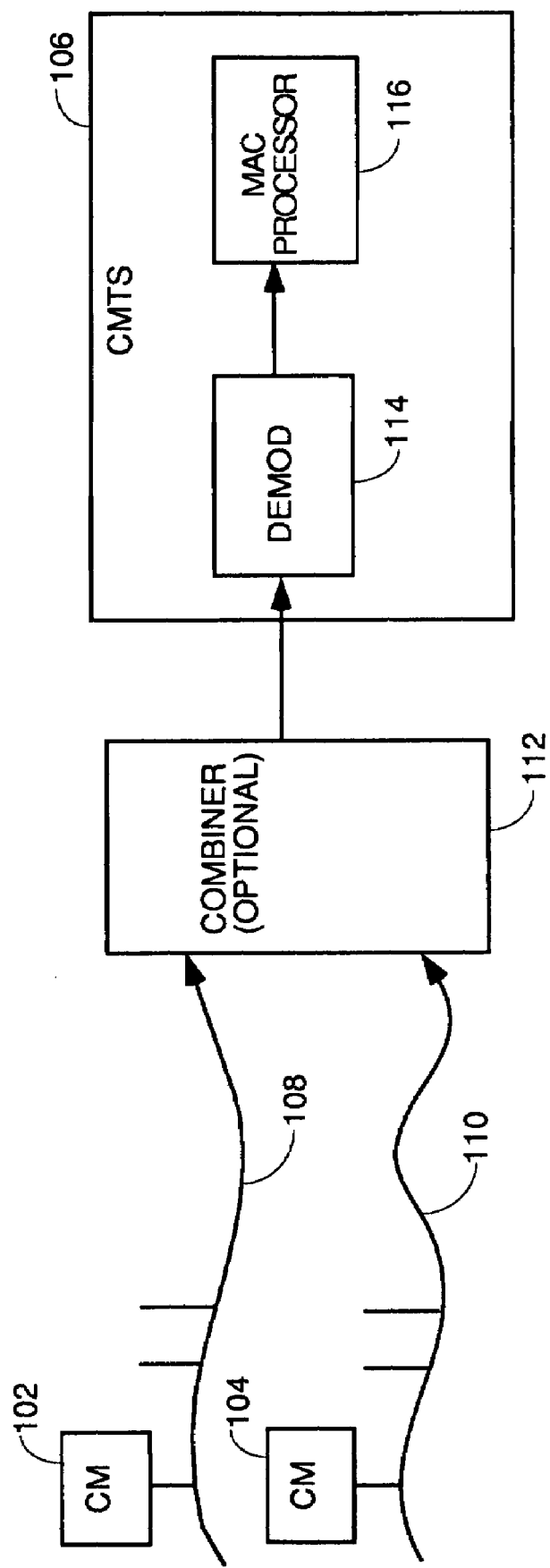
FIG. 8 is a block diagram showing a typical cable system with DOCSIS 1.x and/or 2.0 compatible cable modems 102 and 104 sending upstream data on multiple logical channels to a DOCSIS 1.x and/or DOCSIS 2.0 compatible Cable Modem Termination System (CMTS) via Hybrid Fiber Coax (HFC) networks 108 and 110 and a combiner 112.

FIG. 8 is a block diagram showing a typical cable system with DOCSIS 1.x and/or 2.0 compatible cable modems 102 and 104 sending upstream data on multiple logical channels to a DOCSIS 1.x and/or DOCSIS 2.0 compatible Cable Modem Termination System (CMTS) via Hybrid Fiber Coax (HFC) networks 108 and 110 and a combiner 112. A physical layer demodulator 114 provides upstream data and measurments to a media access control process executed by MAC processor 116. The impulse noise detector circuitry is within demodulator 114. The processes described herein execute as part of the MAC process run by MAC processor 116. The downstream path is not shown, but the UCD messages are sent to the CMs on a downstream path and downstream logical channels which are at least frequency division multiplexed from the upstream logical channels.

Currently offered CMTS from the assignee of the present invention offer 44 different pre-designed modulation profiles. They are categorized as follows: 9 for DOCSIS 1.x TDMA mode; 13 for DOCSIS 2.0 Advanced Time Division Multiple Access (ATDMA) mode; 13 for DOCSIS 2.0 Synchronous Code Division Multiple Access (SCDMA) mode; and 9 for ATDMA-TDMA Shared mode. According to the teachings of the invention, these burst profiles are sorted from maximum noise robustness (minimum throughput capacity) to minimum noise robustness (maximum throughput capacity).

Figure 9A:
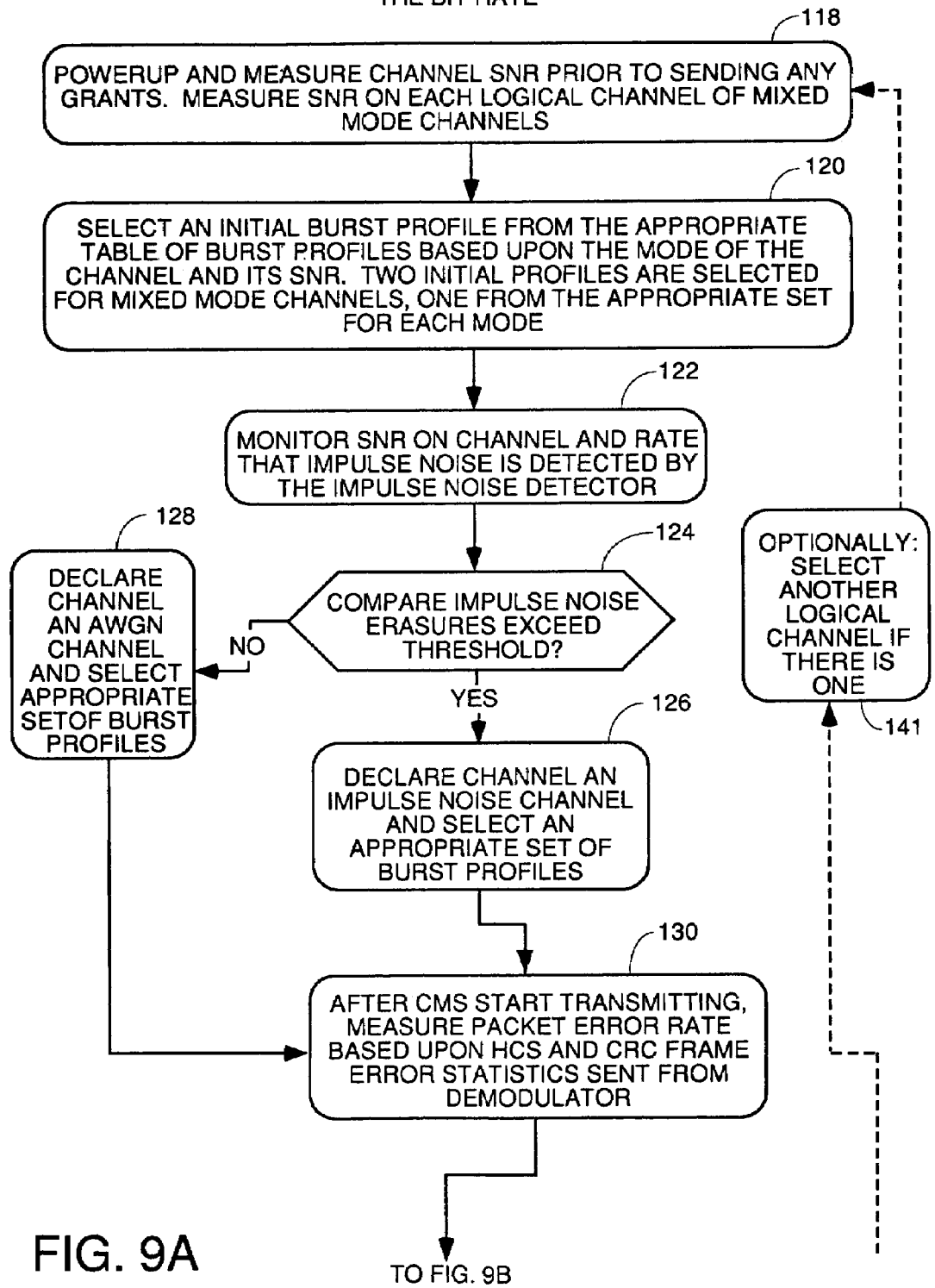
FIG. 9, comprised of FIGS. 9A and 9B, is a flowchart of the preferred process to characterize the channel noise type, set an initial burst profile and then adjust it automatically for changing noise conditions.
Figure 9B:
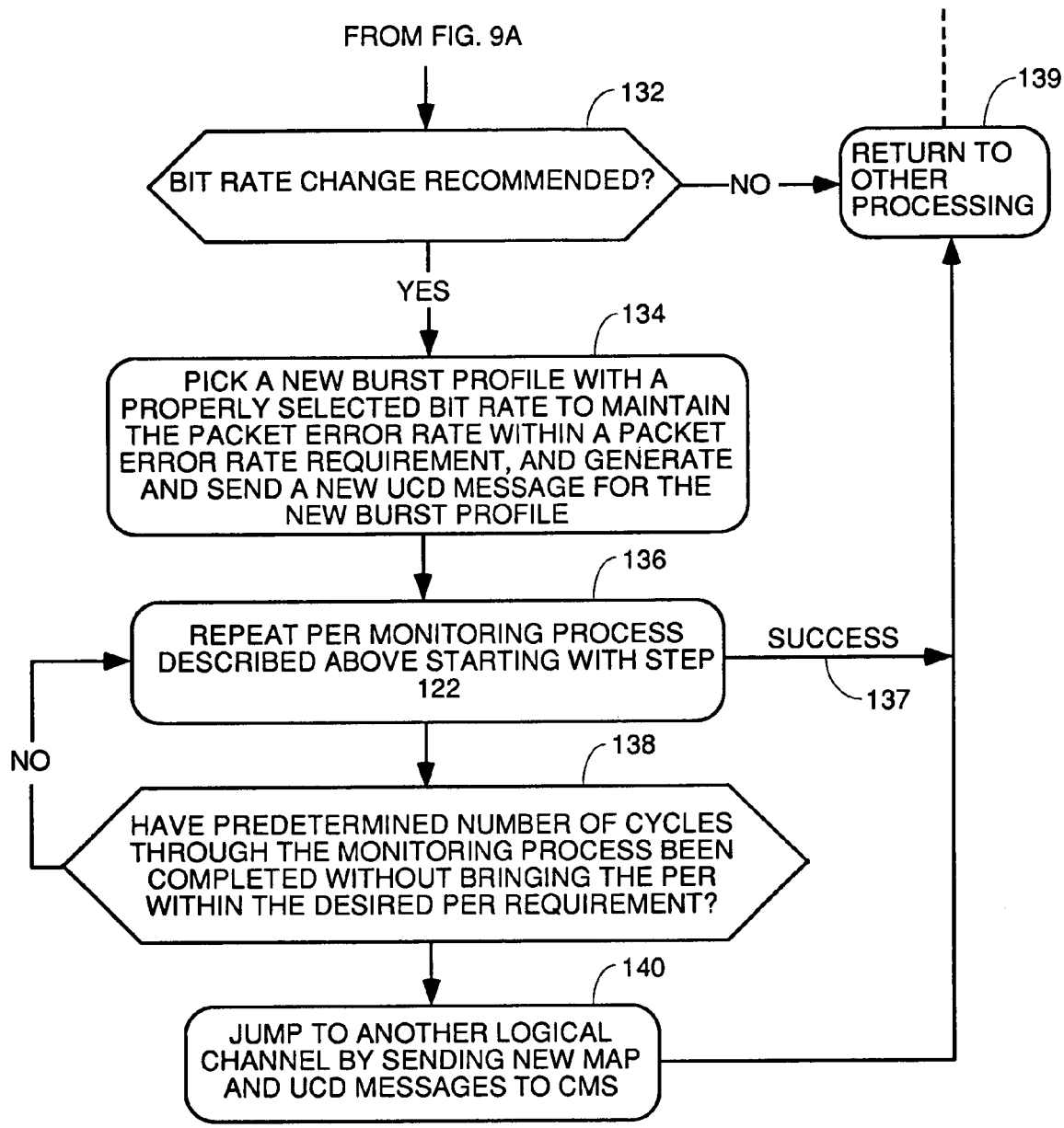

FIG. 9, comprised of FIGS. 9A and 9B, is a flowchart of the preferred process to characterize the channel noise type, set an initial burst profile and then adjust it automatically for changing noise conditions. Step 118 represents powering up the MAC process in the CMTS and measuring the SNR of a logical channel before sending any downstream grants giving any CM permission to transmit on that channel. In the case of mixed mode channels (such as SCDMA on one logical channel during first intervals and TDMA on another logical channel in different intervals), the SNR of each logical channel is measured.

Step 120 represents selecting an initial burst profile from the appropriate set of burst profiles for the channel based upon the mode for that channel (TDMA, ATDMA, SCDMD or ATDMA-TDMA Shared) and the computed SNR. In the case of mixed mode channels, an initial burst profile is selected from the appropriate set for each logical channel.

Step 122 represents monitoring the channel for its SNR and the rate at which the impulse noise detector detects impulse noise. Step 124 represents the process of comparing the impulse noise erasure rate to a threshold to determine if the channel should be characterized as an impulse noise channel or an AWGN channel. If the erasure rate is above the threshold, the channel is declared an impulse noise dominated channel in step 126, and an appropriate set of burst profiles is selected. If the erasure rate is below the threshold, step 128 declares the channel an AWGN dominated channel and selects an appropriate set of burst profiles.

Step 130 represents the process of determining the packet error rate by monitoring the HCS and CRC frame error statistics developed by the error detection circuitry in the MAC processor 116.

Step 132 represents the process performed after either step 126 or 128 is performed of comparing the packet error rate to a programmable packet error rate (PER) threshold previously entered by the cable operator, typically 0.1%. In alternative embodiments, the packet error rate threshold is a fixed number.

If step 132 determines the packet error rate is greater than the PER threshold plus a hysteresis factor, the CMTS automatically decides to increase the noise robustness by selecting the next lower bit rate burst profile in the set appropriate to the dominant noise type, as symbolized by step 134. If the channel is AWGN, the CMTS is free to select any other burst profile in the set of burst profiles including burst profiles specifically designed for impulse noise channels. If however, the channel is dominated by impulse noise, the CMTS must pick the new burst profile with a lower bit rate from only the subset of burst profiles that have been designed to provide noise immunity in the presence of impulse noise for the mode of the channel. If step 132 determines that the PER is less than the PER threshold minus a second hysteresis factor, the CMTS will decide to decrease the noise robustness by selecting the next higher bit rate burst profile in the appropriate set. If the channel is AWGN, the burst profile may be selected from any burst profile in the set, but if the channel is dominated by impulse noise, the new burst profile must be selected from the set of burst profiles designed to give noise immunity in the face of impulse noise for the mode of the channel.

The hysteresis factors insure that the changes in PER must be significant before a change in the burst profile will occur.

It is important that the changes in bit rates cure the PER problem and bring the PER within the desired window of acceptable PER rates. Steps 136 through 140 represent the process of monitoring the effect of repeated attempts to cure the PER problem, and jump to a new channel if the PER rate is not brought within limits. Step 136 represents the process of repeating the PER monitoring process starting with step 122 after the bit rate has been changed and continuing to perform the process and change the bit rate until either the PER is brought within limits or the maximum number of attempts has been made. Step 138 represents the process of determining if the maximum number of attempts to cure the PER problem have been made. If not, step 136 is repeated. If a pass through the process results in success in bringing the PER within limits, path 137 is taken to step 139 to resume other boot processing. Alternatively, step 141 may be performed to pick another logical channel and repeat the process of steps 118 (to calculate the SNR only of the new logical channel) through 140 for another logical channel. If the maximum number of attempts has been made, step 140 is performed to switch to a new logical channel by sending new MAP messages to the CMs that have been using the logical channel in response to bandwidth requests therefrom and sending a new UCD message if necessary to define the logical channel and desired burst profile the CMs are being instructed to switch to in the MAP messages.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

What is claimed is:

1. A process for automatically altering the data rate on a logical channel with changing noise conditions, comprising:
   1) resetting a flawed packet counter for said logical channel;
   2) resetting a total packets received counter for said logical channel;
   3) receiving a packet on said logical channel, and incrementing the total packet received counter;
   4) processing error detection data in said packet to determine if there is an error in the packet, and, if so, incrementing said flawed packet counter;
   5) comparing the count in said total packet counter to a number representing the desired number of packets to be received before a determination of packet loss percentage is made;
   6) if the number of packets received is less than the desired number, returning to step 3;
   7) if the number of packets received is equal to or exceeds the desired number of packets received, calculating a packet loss percentage by dividing the number of flawed packets by the total number of packets received and comparing the packet loss percentage to one or more packet loss thresholds wherein the comparison includes
   A) first comparing said packet loss percentage to a first threshold and calculating said first threshold by evaluating the expression:

$$packet\_loss\_required*(1+TH1)$$

where packet_loss_required is a programmable number representing the desired maximum packet loss percentage and TH1 is a constant representing a first hysteresis threshold;
   B) if said packet loss percentage is greater than or equal to said first threshold, making the determination that a reduction in data rate is required and proceeding to step 9;
   C) if said packet loss percentage is not greater than or equal to said first threshold, comparing said packet loss percentage to a second threshold and calculating said second threshold by evaluating the expression:

$$packet\_loss\_required*(1+TH2)$$

where packet_loss_required is a programmable number representing the desired maximum packet loss percentage and TH2 is a constant representing a second hysteresis threshold;
   D) if said packet loss percentage is less than or equal to said second threshold, making the determination that an increase in data rate is required and proceeding to step 9;
   8) determining if a change in data rate throughput is required based upon the comparison of the packet loss percentage to the one or more packet loss thresholds; and
   9) if a change in data rate throughput is required, generating a signal indicating the need for a change in data rate for said logical channel.

2. The process of claim 1 further comprising the steps of determining in step 3 whether an incoming packet is transmitted in response to a contention grant, and, if said packet is transmitted in response to a contention grant, discarding said packet and not incrementing the packet received counter or the flawed packet counter, and further comprising a step 10 comprising the substeps of either selecting a new burst profile with an appropriate data rate throughput and generating and transmitting a upstream channel descriptor message setting new data rate throughput parameters of said selected burst profile, or selecting a new burst profile and generating a visible or audible notification to a system operator informing of the need for a change in data rate throughput and suggesting the new burst profile that should be used, and returning to step 1 for a new logical channel.

3. The process of claim 1 further comprising a step performed before any processing to determine if an operator has turned automatic rate adaptation on for all logical channels.

4. The process of claim 1 further comprising a step performed before any processing to determine if an operator has turned automatic rate adaptation on for the particular logical channel to be processed.

5. The process of claim 1 further comprising the step of generating an upstream channel descriptor message having descriptor data that defines a data rate that is different from the existing data rate of said logical channel and appropriate to the currently existing noise conditions, and transmitting said upstream channel descriptor message at least to all cable modems that may be assigned to use said logical channel.

6. The process of claim 1 further comprising the steps:
   if step 8 determines that a change in data rate throughput is not required, returning to step 1 and begin processing for a new logical channel; and
   if step 9 determines that a change in data rate is required, selecting a new burst profile with a data rate which is changed appropriately for the current noise conditions on said logical channel, and generating and transmitting an upstream channel descriptor message that contains data that controls cable modems to transmit using the changed data rate.

7. The process of claim 1 further comprising the steps:
   picking a new logical channel and repeating the process if the packet loss percentage is determined to be greater than said second threshold.

8. A process for automatically altering the data rate on a logical channel with changing noise conditions, comprising:
   1) resetting an average noise filter or accumulator or memory location for said logical channel;
   2) resetting a total packets received counter for said logical channel;
   3) receiving a packet on said logical channel, and incrementing the total packet received counter if said packet is not transmitted in response to a contention grant and discarding said packet if it is transmitted in response to a contention grant;
   4) processing a received packet to determine the average noise if the packet has not been discarded and updating a running average noise value using the average noise in the packet;
   5) comparing the count in said total packet counter to a number representing the desired number of packets to be received before a determination of channel signal-to-noise ratio is made;
   6) if the number of packets received is less than the desired number, returning to step 3; and
   7) if the number of packets received is equal to or exceeds the desired number of packets received, determining the SNR of the logical channel, determining if the SNR of the logical channel is less than the value SNR_REQUIRED*(1−TH1) where SNIR_REQUIRED is a desired SNR for the logical channel and TH1 is a burst profile in use representing a first SNIR threshold, reducing the data rate of the logical channel if the SNR of the logical channel is lower than or equal to the value SNR_REQUIRED*(1−TH1), and increasing the data rate of the logical channel if the SNR of the logical channel is greater than SNR_REQUIRED*(1−TH2).

9. The process of claim 8 wherein if the SNR of the logical channel is lower than or equal to the value SNR_REQUIRED*(1−TH1), the data rate is reduced by selecting a next burst profile down from a currently selected burst profile for the logical channel being processed, said next burst profile down being selected from a table of burst profiles arranged in order of descending data rates.

10. The process of claim 8 wherein if the SNR of the logical channel is lower than or equal to the value SNR_REQUIRED*(1−TH1), the data rate is increased by selecting a next burst profile up from a currently selected burst profile for the logical channel being processed, said next burst profile up being selected from a table of burst profiles arranged in order of ascending data rates.

11. The process of claim 8 further comprising:
generating a signal which can be seen or heard by an operator suggesting a change in data rate for the channel such that said operator can manually select a new data rate and cause a new upstream channel descriptor message to be generated and sent if the operators chooses to change the data rate.

12. A process for automatically altering the data rate on a logical channel with changing noise conditions comprising:
 1) resetting a total uncorrectable codeword count for said logical channel for an interval;
 2) resetting a total codewords received count for said logical channel for said interval;
 3) receiving a burst on said logical channel, and adding the total codewords received in the burst to the running total of codewords received for said interval;
 4) receiving information regarding the number of uncorrectable codewords in said received burst and adding said number of uncorrectable codewords to a running total of uncorrectable codewords for the logical channel over said interval;
 5) determining in any way whether said interval has been completed;
 6) if said interval has not been completed, returning to step 3;
 7) if said interval has been completed, calculating a byte error rate of said logical channel and comparing the byte error rate to one or more byte error rate thresholds, the byte error rate calculated by evaluating the expression $$\text{ByteErrorRate} = [(T+1)*n\_error]/[(k+2T)*n\_total]$$

where T is the number of maximum correctable bytes in an Reed-Solomon (hereafter R-S) codeword n_error is the total number of uncorrectable R-S codewords for said interval from predetermined interval usage code (IUC) burst type(s), n_total is the total number of received R-S codewords from predetermined IUC burst type(s) received within said time interval, k is the number of information bytes in an R-S codeword of a specific IUC; and (k+2T) stands for: the R-S codeword length in bytes;
 8) determining if a change in data rate throughput is required based upon the comparison of the byte error rate to the one or more byte error rate thresholds; and 9) if a change in data rate throughput is required, generating a signal indicating a need for a change in the data rate of said logical channel.

13. The process of claim 12 wherein step (9) comprises reducing the data rate by selecting the next burst profile down from the currently selected burst profile for the logical channel being processed, said next burst profile down being selected from a table of burst profiles arranged in order of descending data rates and generating and transmitting downstream and upstream channel descriptor message containing the parameters for transmission on said logical channel including parameters which set said new data rate.

14. The process of claim 12 wherein step (9) comprises increasing the data rate by selecting the next burst profile up from the currently selected burst profile for the logical channel being processed, said next burst profile up being selected from a table of burst profiles arranged in order of ascending data rates and generating and transmitting downstream and upstream channel descriptor message containing the parameters for transmission on said logical channel including parameters which set said new data rate.

15. The process of claim 12 wherein step (9) comprises generating a signal which can be seen or heard by an operator suggesting a change in data rate for the channel such that said operator can manually select a new data rate and cause a new upstream channel descriptor message to be generated and sent if the operators chooses to change the data rate.

16. A process for automatically altering the data rate on a logical channel with changing noise conditions comprising:
 1) resetting a total uncorrectable codeword count for said logical channel for an interval;
 2) resetting a total codewords received count for said logical channel for said interval;
 3) receiving a burst on said logical channel, and adding the total codewords received in the burst to the running total of codewords received for said interval;
 4) receiving information regarding the number of uncorrectable codewords in said received burst and adding said number of uncorrectable codewords to a running total of uncorrectable codewords for the logical channel over said interval;
 5) determining in any way whether said interval has been completed;
 6) if said interval has not been completed, returning to step 3;
 7) if said interval has been completed, calculating a bit error rate of said logical channel and comparing the bit error rate to one or more bit error rate thresholds, the bit error rate calculated by evaluating the expression $$BER = [0.5*(T+1)*n\_error]/[(k+2T)*n\_total]$$

where T is the number of maximum correctable bytes in an Reed-Solomon (hereafter R-S) codeword, n_error is the total number of uncorrectable R-S codewords for said interval from predetermined interval usage code (IUC) burst type(s), n total is the total number of received R-S codewords from predetermined IUC burst type(s) received within said time interval, k is the number of information bytes in an R-S codeword of a specific IUC; and (k+2t) stands for: the R-S codeword length in bytes;
 8) determining if a change in data rate throughput is required based upon the comparison of the bit error rate to the one or more byte error rate thresholds; and
 9) if a change in data rate throughput is required, generating a signal indicating a need for a change in the data rate of said logical channel.

17. The process of claim 16 wherein step (9) comprises reducing the data rate by selecting the next burst profile down from the currently selected burst profile for the logical channel being processed, said next burst profile down being selected from a table of burst profiles arranged in order of descending data rates and generating and transmitting downstream and upstream channel descriptor message containing the parameters for transmission on said logical channel including parameters which set said new data rate.

18. The process of claim 16 wherein step (9) comprises increasing the data rate by selecting the next burst profile up from the currently selected burst profile for the logical channel being processed, said next burst profile up being selected from a table of burst profiles arranged in order of ascending data rates and generating and transmitting downstream and upstream channel descriptor message containing the parameters for transmission on said logical channel including parameters which set said new data rate.

19. The process of claim 16 wherein step (9) comprises generating a signal which can be seen or heard by an operator suggesting a change in data rate for the channel such that said operator can manually select a new data rate and cause a new upstream channel descriptor message to be generated and sent if the operators chooses to change the data rate.

20. A process carried out in a cable modem termination system comprising the steps:
(1) powering up and measuring the signal-to-noise ratio (SNR) on a channel prior to transmitting any downstream grant messages authorizing cable modems to transmit on said channel;
(2) selecting an initial burst profile from a table of burst profiles appropriate to said channel based upon a mode of operation of said channel, said selection based upon said SNR of said channel;
(3) monitoring SNR of said channel and a rate that impulse noise is detected on said channel;
(4) comparing the amount of impulse noise erasures to one or more erasure thresholds and deciding whether said logical channel is dominated by Average White Gaussian Noise (AWGN) or impulse noise, and selecting an appropriate set of burst profiles for said channel based upon the dominant noise type;
(5) after cable modems start transmitting on said channel, determining a packet error rate for packets transmitted on said channel;
(6) comparing the packet error rate to one or more thresholds and deciding whether a change in bit rate on said channel is advisable to bring said packet error rate within predetermined limits;
(7) if a change is bit rate is indicated by step (6), automatically picking a new burst profile with an appropriately changed bit rate from said set of burst profiles selected in step 4.

21. The process of claim 20 wherein step 4 comprising comparing said amount of impulse noise erasures to an upper limit threshold to determine when a channel has become dominated by impulse noise, and comparing said amount of impulse noise erasures to a tower limit to decide when said channel has become dominated by AWGN, said upper and lower thresholds being separated by an amount sufficient to provide a hysteresis effect.

22. The process of claim 20 wherein step 6 comprising comparing said packet error rate to an upper limit threshold to determine when a channel should have its bit rate lowered, and comparing said packet error rate to a lower limit to decide when said channel should have its A rate increased, said upper and lower thresholds being separated by an amount sufficient to provide a hysteresis effect.

23. The process of claim 20 wherein step 7 further comprises automatically generating and sending an upstream channel descriptor message which includes parameters set by said new burst profile so as to cause cable modems transmitting on said channel to alter their bit rates.

24. The process of claim 20 wherein step 7 further comprises sending a message to said cable operator indicating it would be desirable to manually change said bit rate.

25. The process of claim 20 further comprising the steps:
(8) repeating steps 3 through 7 until either said packet error rate has been brought within acceptable limits or a maximum number of attempts have been made;
(9) if a maximum number of attempts have been made without success in bringing the packet error rate (PER) within limits, jumping to another logical channel by sending new bandwidth allocation map (MAP) messages to all cable modems (CMs) that have been using the logical channel for which the PER cannot be brought within limits instructing said CMs when they may transmit on the new logical channel and, if necessary, sending an upstream channel descriptor message defining the characteristics and burst profile of said new logical channel.

* * * * *